(12) United States Patent
Chen et al.

(10) Patent No.: US 8,928,026 B2
(45) Date of Patent: Jan. 6, 2015

(54) OPTOELECTRONIC DEVICE AND METHOD FOR MANUFACTURING THE SAME

(75) Inventors: Chao-Hsing Chen, Hsinchu (TW); Chien-Fu Shen, Hsinchu (TW); Schang-Jing Hon, Hsinchu (TW); Tsun-Kai Ko, Hsinchu (TW); Wei-Yo Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/565,993

(22) Filed: Aug. 3, 2012

(65) Prior Publication Data

US 2013/0032848 A1 Feb. 7, 2013

(30) Foreign Application Priority Data

Aug. 4, 2011 (TW) .............................. 100127879 A
Mar. 16, 2012 (TW) .............................. 101109301 A

(51) Int. Cl.
*H01L 33/00* (2010.01)
*H01L 33/38* (2010.01)
*H01L 33/40* (2010.01)
*H01L 33/20* (2010.01)

(52) U.S. Cl.
CPC ................ *H01L 33/38* (2013.01); *H01L 33/40* (2013.01); *H01L 2933/0016* (2013.01); *H01L 33/20* (2013.01)
USPC ............... 257/99; 257/98; 257/100; 257/101; 257/103

(58) Field of Classification Search
USPC .............................................. 257/79, 94–100
See application file for complete search history.

(56) References Cited

U.S. PATENT DOCUMENTS

| | | | | |
|---|---|---|---|---|
| 6,573,537 B1 * | 6/2003 | Steigerwald et al. | ......... | 257/103 |
| 8,017,967 B2 * | 9/2011 | Suehiro et al. | .................. | 257/99 |
| 8,247,823 B2 * | 8/2012 | Yahata et al. | ................... | 257/79 |
| 8,309,971 B2 * | 11/2012 | Seo et al. | ......................... | 257/79 |
| 2002/0070386 A1 * | 6/2002 | Krames et al. | .................. | 257/94 |
| 2009/0272994 A1 * | 11/2009 | Lim | ............................... | 257/97 |

* cited by examiner

*Primary Examiner* — Matthew W Such
*Assistant Examiner* — Frederick B Hargrove
(74) *Attorney, Agent, or Firm* — Bacon & Thomas, PLLC

(57) ABSTRACT

An optoelectronic device comprises a semiconductor stack comprising a first semiconductor layer, an active layer and a second semiconductor layer, a first electrode electrically connecting with the first semiconductor layer, a second electrode electrically connecting with the second semiconductor layer, wherein there is a smallest distance D1 between the first electrode and the second electrode, a third electrode formed on a portion of the first electrode and electrically connecting with the first electrode and a fourth electrode formed on a portion of the first electrode and on a portion of the second electrode, and electrically connecting with the second electrode, wherein there is a smallest distance D2 between the third electrode and the fourth electrode, and the smallest distance D2 is smaller than the smallest distance D1.

20 Claims, 13 Drawing Sheets

US 8,928,026 B2

OPTOELECTRONIC DEVICE AND METHOD FOR MANUFACTURING THE SAME

REFERENCE TO RELATED APPLICATION

This application claims the right of priority based on TW application Serial No. 100127879, filed on Aug. 4, 2011 and TW application Serial No. 101109301, filed on Mar. 16, 2012, and the content of which is hereby incorporated by reference in its entirety.

TECHNICAL FIELD

The application is related to a wavelength converter structure and the manufacturing method thereof, and particularly to a wavelength converter structure and the manufacturing method thereof with high light extraction efficiency.

DESCRIPTION OF BACKGROUND ART

Light-emitting diode is a kind of semiconductor device used widely as a light source. Light-emitting diode has the advantages of power-saving and long lifetime compared to traditional light source such as incandescent bulb and fluorescent lamp. Thus, light-emitting diode has gradually replaced the traditional light source to be applied to various fields such as traffic signs, backlight module, street lights, and medical equipment, etc. As the brightness of light-emitting diode is demanded to be higher, the industry has focused on how to improve the lighting efficiency to increase the brightness.

FIG. 1 shows a known LED package 10 of the semiconductor lighting device comprises the semiconductor LED chip 12 encapsulated by encapsulation 11, wherein the semiconductor LED chip 12 comprises a p-n junction 13 and encapsulation 11 is usually made of thermosetting material such as epoxy or thermal plastic material. The semiconductor LED chip 12 is connected with two conductive frames 15, 16 by a wire 14. Because epoxy would degrade at high temperature, it is only used in low temperature environment. Besides, epoxy with high thermal resistance provides the semiconductor LED chip 12 high resistance heat dissipation paths and limits the application of LED package 10 in the low power consumption.

SUMMARY OF THE DISCLOSURE

An optoelectronic device comprises a semiconductor stack comprising a first semiconductor layer, an active layer and a second semiconductor layer, a first electrode electrically connecting with the first semiconductor layer, a second electrode electrically connecting with the second semiconductor layer, wherein there is a smallest distance D1 between the first electrode and the second electrode, a third electrode formed on a portion of the first electrode and electrically connecting with the first electrode and a fourth electrode formed on a portion of the first electrode and on a portion of the second electrode, and electrically connecting with the second electrode, wherein there is a smallest distance D2 between the third electrode and the fourth electrode, and the smallest distance D2 is smaller than the smallest distance D1.

DETAILED DESCRIPTION OF PREFERRED EMBODIMENTS

In order to explain the application in more detail, please refer to the following description with FIGS. 2A to 3C.

Figure 1:
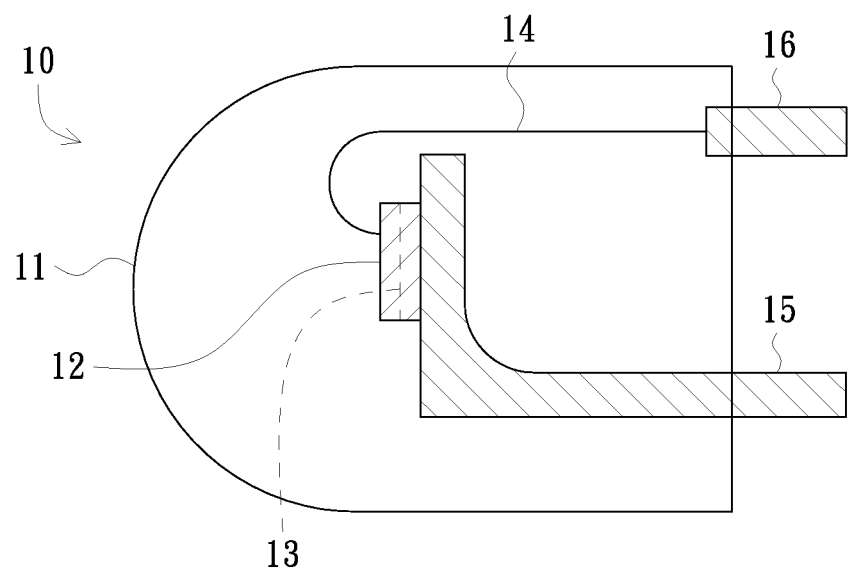
FIG. 1 shows the structure of the conventional light-emitting device.
Figure 2A:
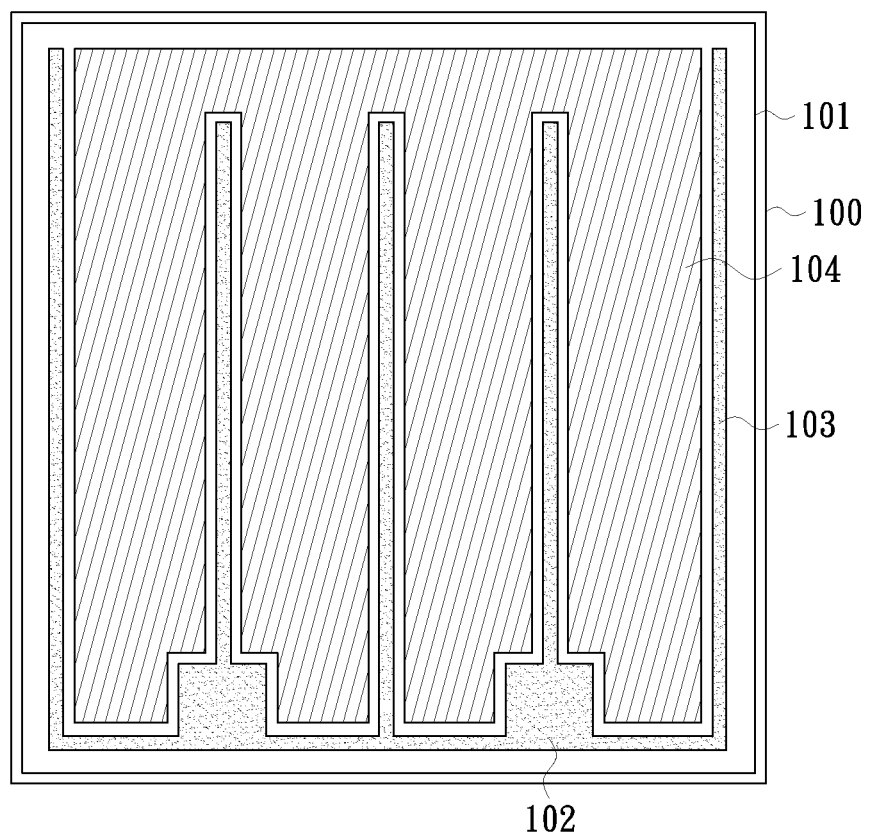
FIGS. 2A-2D, 2F-2H show the top view of the optoelectronic device in accordance with one embodiment of the present application.

FIGS. 2A to 2H show the top view of an optoelectronic device in accordance with the first embodiment. As FIG. 2A shows, an optoelectronic device disclosed in the first embodiment comprises a substrate 100, a first semiconductor layer 101, a first electrode 102 and multiple first extension electrodes 103 extended from the first electrode 102. An active layer (not shown) and a second semiconductor layer (not shown) are formed on the first semiconductor layer 101, and a second electrode 104 is formed on the second semiconductor layer (not shown).

Figure 2B:
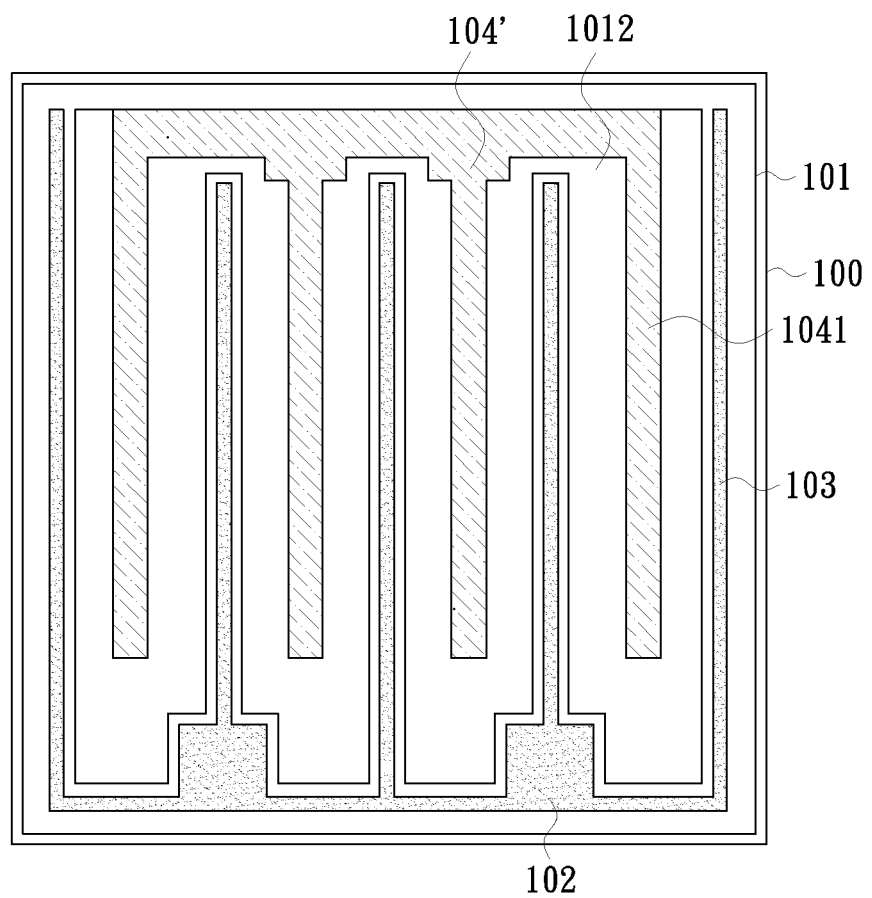

Besides, as FIG. 2B shows, the second electrode 104' formed on the second semiconductor layer 1012 also comprises multiple second extension electrodes 1041 extended from the second electrode 104'. In an embodiment, one of the multiple second extension electrodes 1041 can be formed between two of the multiple first extension electrodes 103. In an embodiment, a reflective layer (not shown) can also be selectively formed on the area of the second semiconductor layer 1012 where is not covered by the second electrode 104 and the second extension electrodes 1041 to improve the reflectivity. The first extension electrodes 103 and the second extension electrodes 1041 mentioned above can be arc-shaped or curve based on different layouts.

Figure 2C:
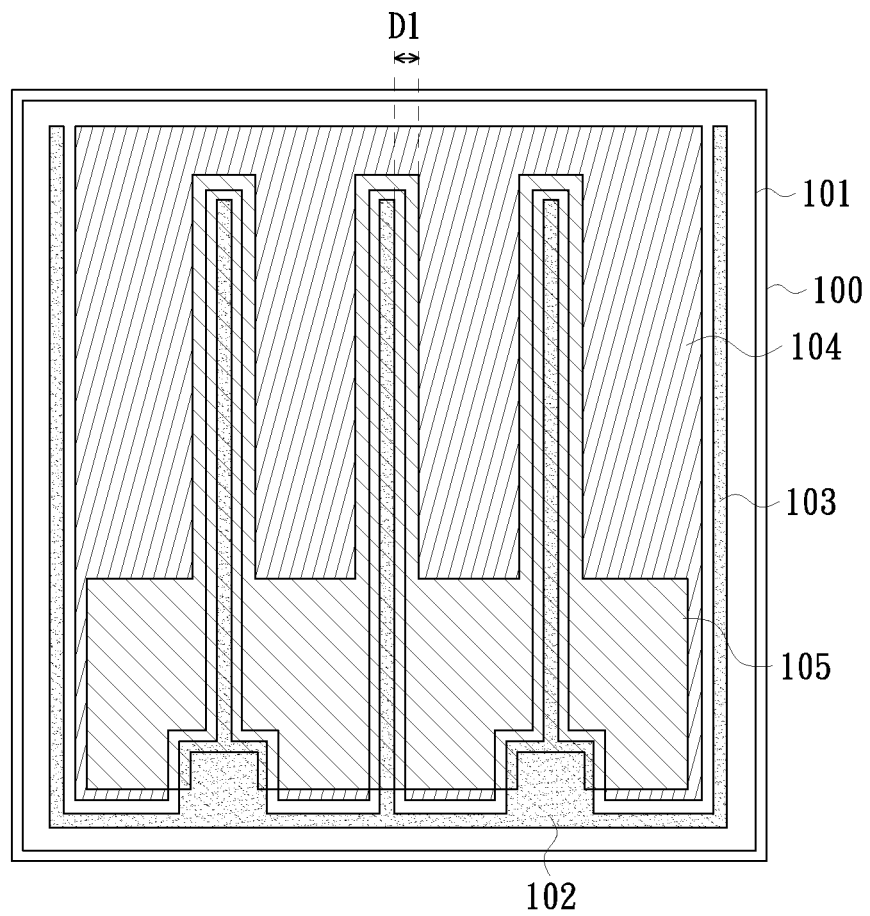

Following FIG. 2A, FIG. 2C shows a first insulation layer 105 covering a portion of the second electrode 104 and a portion of the multiple first extension electrodes 103 to reveal the first electrode 102, a portion of the multiple first extension electrodes 103 and a portion of the second electrode 104. A smallest distance D1 can be defined between the first extension electrodes 103 and the second electrode 104. The smallest distance D1 between the first extension electrodes 103 and the second electrode 104 can be in a range of 10~50 µm, 10~40 µm, 10~30 µm, 10~20 µm, or 10~15 µm.

Figure 2D:
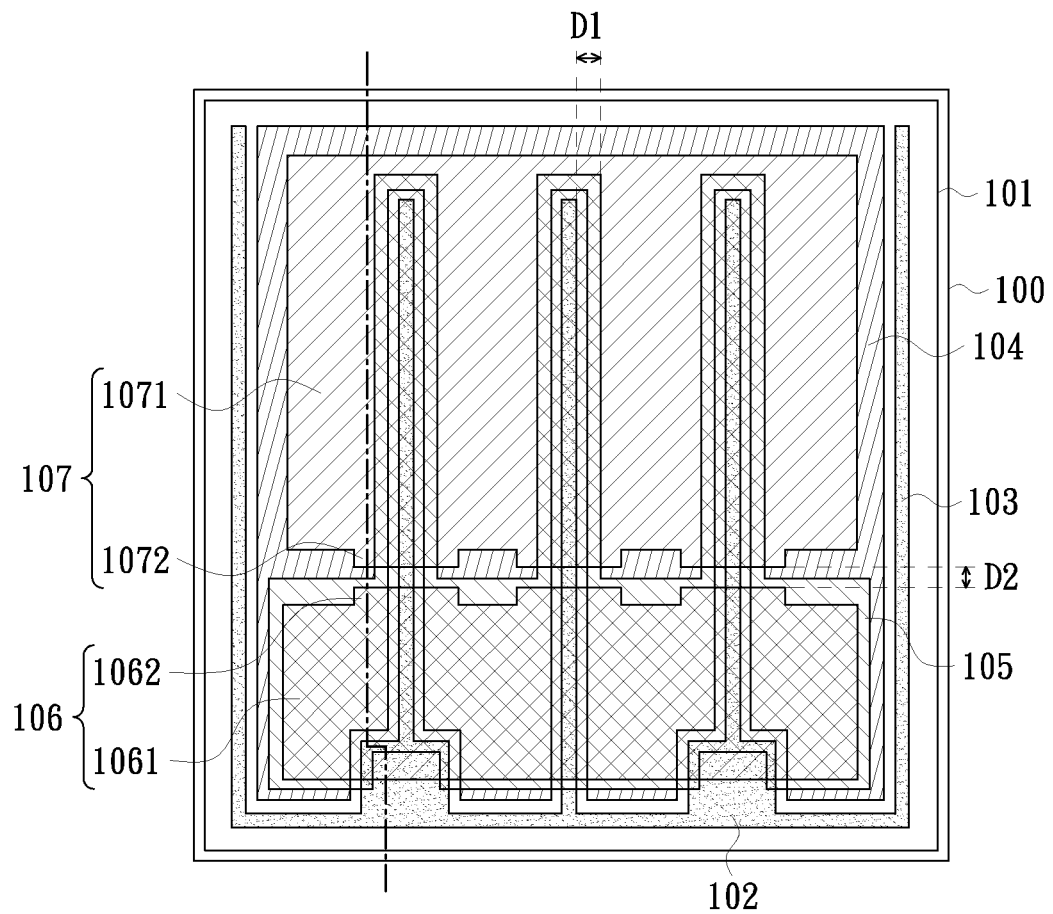

Finally, as FIG. 2D shows, a third electrode 106 can be formed on the first electrode 102, the first extension electrodes 103 and the first insulation layer 105, and electrically connects to the first electrode 102 and the first extension electrodes 103. A fourth electrode 107 can be formed on the second electrode 104 and a portion of the first insulation layer 105, and electrically connects to the second electrode 104.

The third electrode 106 comprises a first main region 1061 and multiple first protrusions 1062. The first main region 1061 can be an approximately rectangular structure, and the multiple first protrusions 1062 can be extended from the first main region 1061 to the revealed portion of the first extension electrodes 103 which is not covered by the first main region 1061. The fourth electrode 107 comprises a second main region 1071 and multiple second protrusions 1072. The second planar regions 1072 can be extended from the second main region 1071 and cover a portion of the first insulation layer 105 which is not covered by the second main region 1071. The multiple first protrusions 1062 and the second protrusions 1072 can define a smallest distance D2. The smallest distance D2 between the first protrusions 1062 and the second protrusions 1072 can be in a range of 1-10 μm, 2-10 μm, 4-10 μm, 6-10 μm, or 8-10 μm.

In the embodiment, the abovementioned multiple first protrusions 1062 and the second protrusions 1072 can be as close as possible to increase the area of the first extension electrodes 103 where is covered to decrease the area of the first insulation layer 105 where is not covered to increase the contacting area of the third electrode 106 and the first extension electrodes 103 to increase the electrical reliability, and to decrease the revealed area of the insulation layer 105 to increase the reflective area for reflecting light and increasing light extraction.

In one embodiment, in order to obtain the abovementioned function, the smallest distance D2 between the first protrusions 1062 and the second protrusions 1072 should be as small as possible, and can be smaller than the smallest distance D1 between the first extension electrodes 103 and the second electrode 104.

In one embodiment, the area of the first extension electrodes 103 which is not covered by the third electrode 106 and the fourth electrode 107 is smaller than 2%, 1.8%, 1.5%, 1.3%, 1% or 0.8% of the total area of the first extension electrodes 103.

Figure 2E:
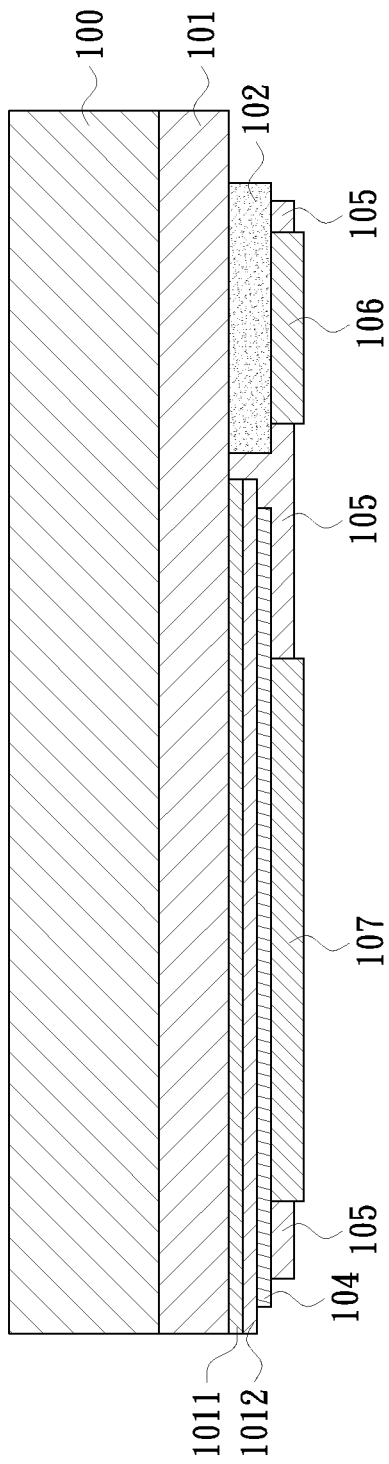
FIG. 2E shows the cross-sectional diagram of the optoelectronic device in accordance with one embodiment of the present application.

FIG. 2E shows the cross-sectional diagram of the dotted line in FIG. 2D. The optoelectronic device comprises a substrate 100, a first semiconductor layer 101, an active layer 1011 and a second semiconductor layer 1012 formed on the substrate 100, a first electrode 102 formed on the first semiconductor layer 101, and a second electrode 104 formed on the second semiconductor layer 1012. As mentioned above, firstly, the first insulation layer 105 divides the first electrode 102 and the second electrode 104, and the third electrode 106 and the fourth electrode 107 are formed on the first electrode 102 and the second electrode 104 respectively.

Figure 2F:
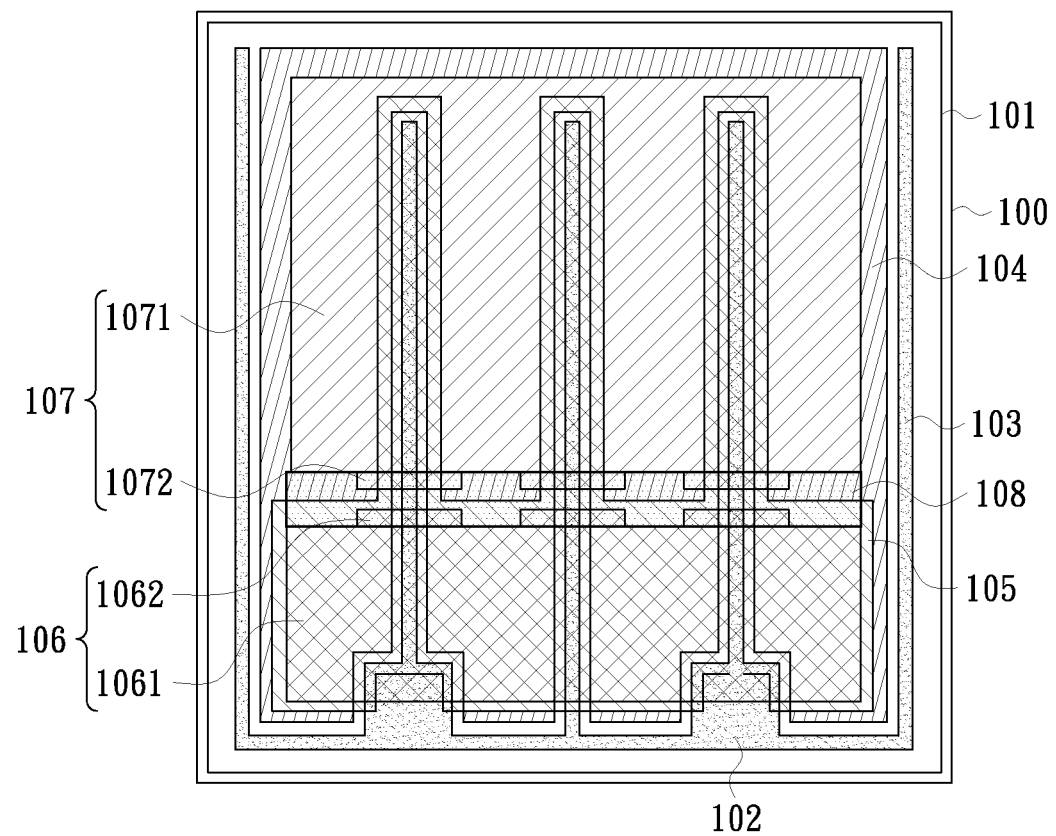

As FIG. 2F shows, in one embodiment, a second insulation layer 108 is formed to cover the abovementioned first protrusions 1062, the second protrusions 1072, a portion of the first extension electrodes 103, and a portion of the first insulation layer 105 to prevent short-circuit due to the shrinkage of the smallest distance D2 between the first protrusions 1062 and the second protrusions 1072.

Figure 2G:
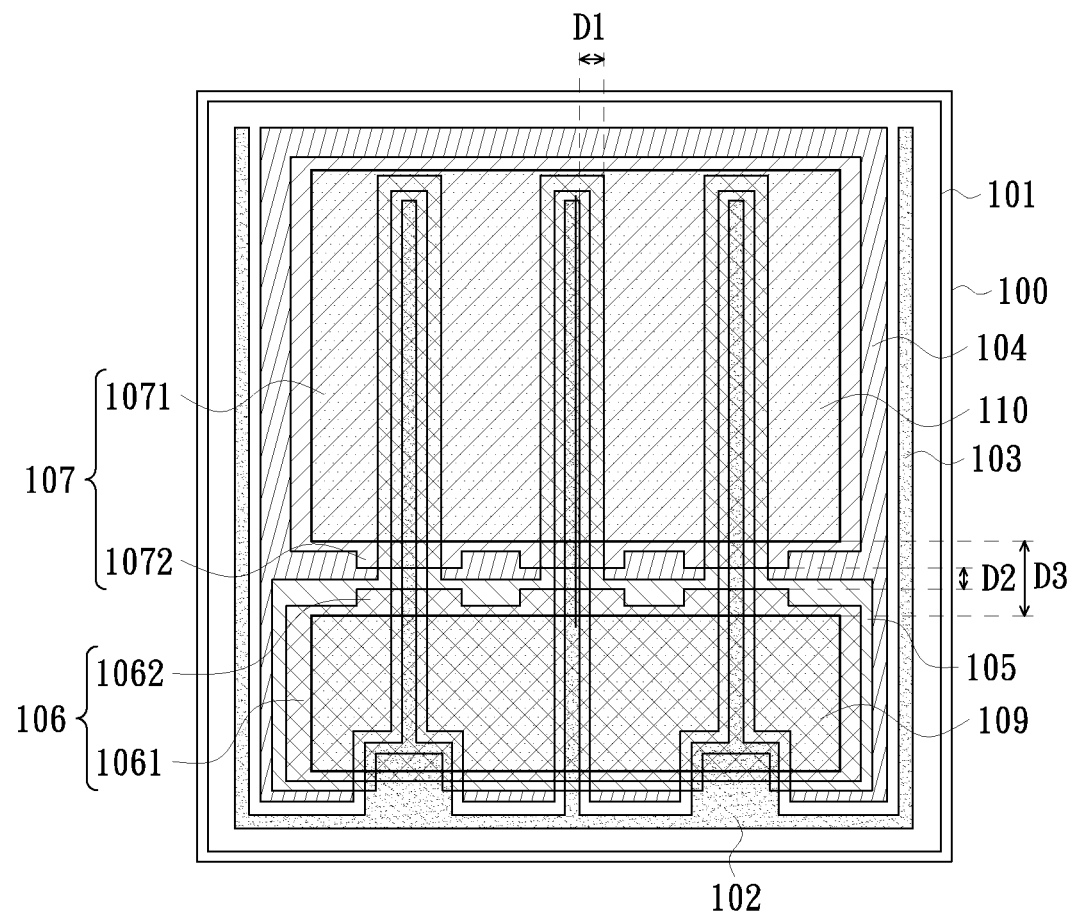

As FIG. 2G shows, in one embodiment, a first bonding pad 109 and a second bonding pad 110 are formed on the third electrode 106 and the fourth electrode 107 respectively. The first bonding pad 109 and the second bonding pad 110 are approximately rectangular structure and define the smallest distance D3 between the first bonding pad 109 and the second bonding pad 110. In one embodiment, the smallest distance D2 between the first protrusions 1062 and the second protrusions 1072 can be smaller than the smallest distance D3 between the first bonding pad 109 and the second bonding pad 110. The smallest distance D3 between the first bonding pad 109 and the second bonding pad 110 can be in a range of 40~600 μm, 60~600 μm, 80~600 μm, 100~600 μm, 150~600 μm, 200~600 μm, 250~600 μm, 300~600 μm, 350~600 μm, 400~600 μm, 450~600 μm, 500~600 μm, or 550~600 μm.

Figure 2H:
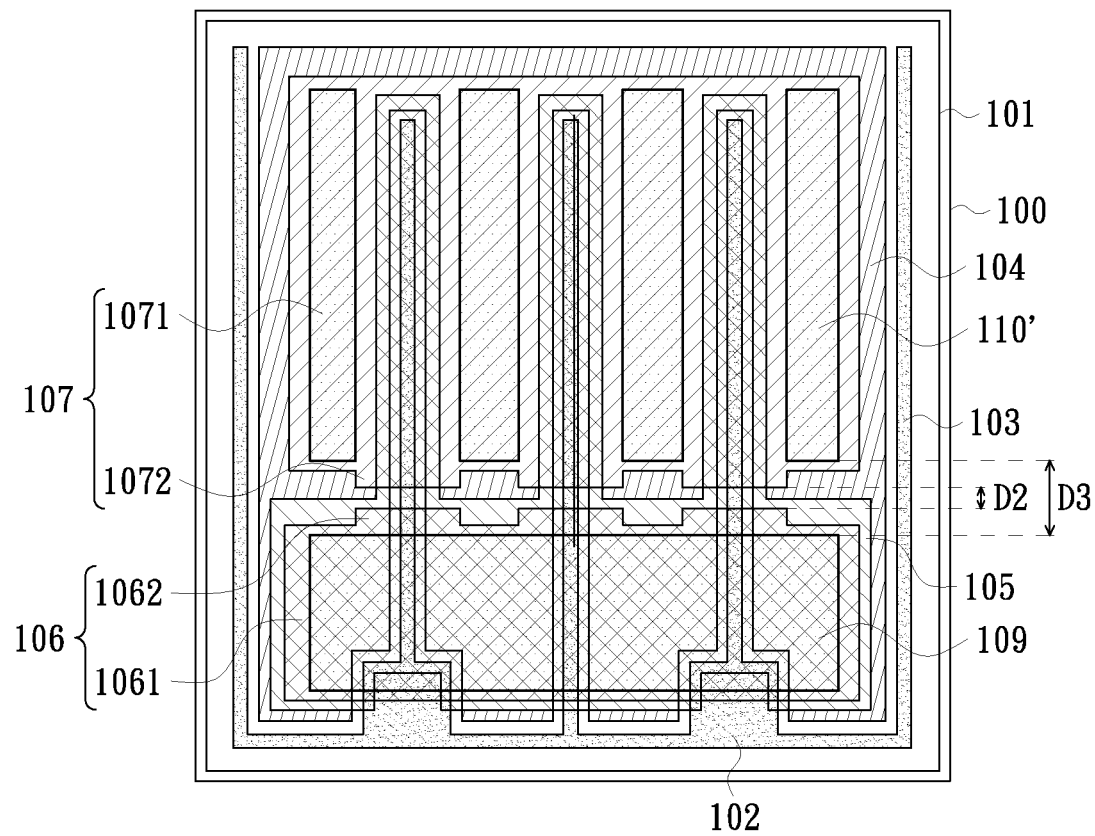

As FIG. 2H shows, in one embodiment, a plurality of second bonding pads 110' is formed on the fourth electrode 107 and does not cover the first extension electrodes 103.

The first electrode 102, the first extension electrodes 103, the second electrode 104, the third electrode 106, the fourth electrode 107, the first bonding pad 109 and the second bonding pad 110, 110' are made of metal material such as Cr, Ti, Ni, Pt, Cu, Au, Al, W, Sn, or Ag.

Figure 3A:
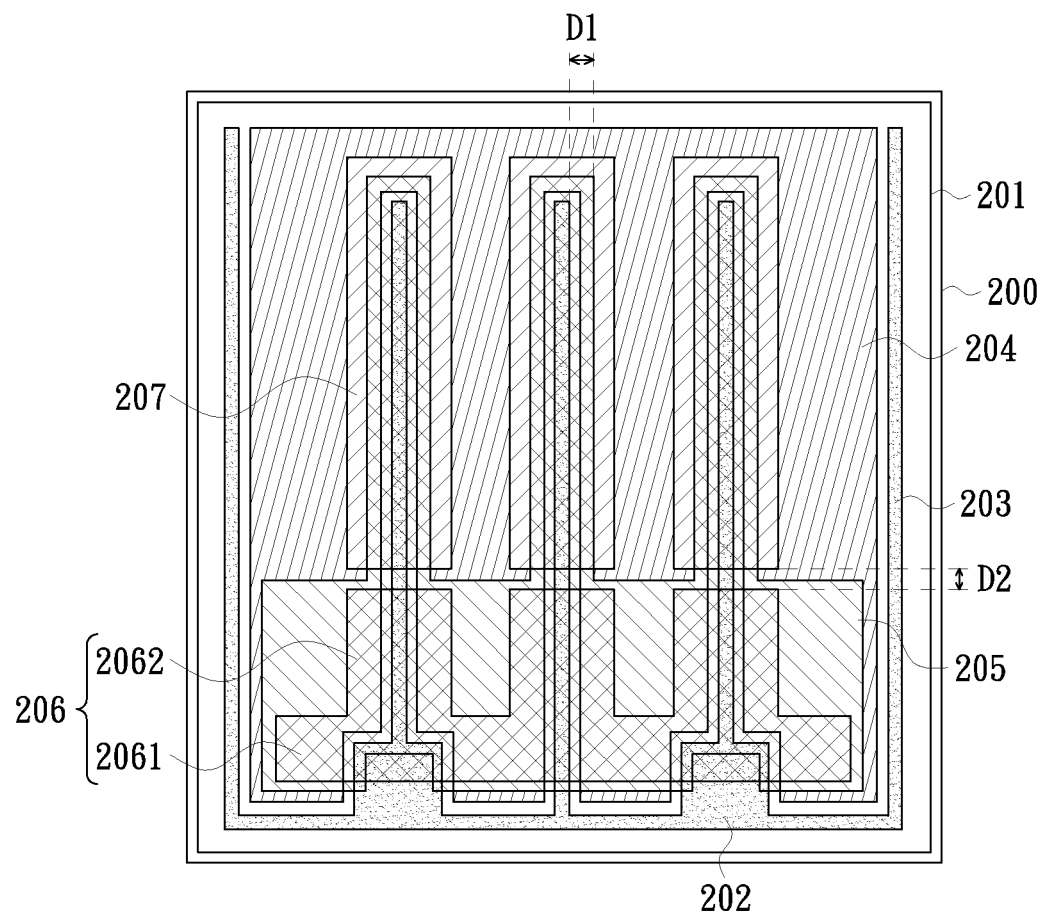
FIGS. 3A-3D show the top view of the optoelectronic device in accordance with one embodiment of the present application.
Figure 3B:
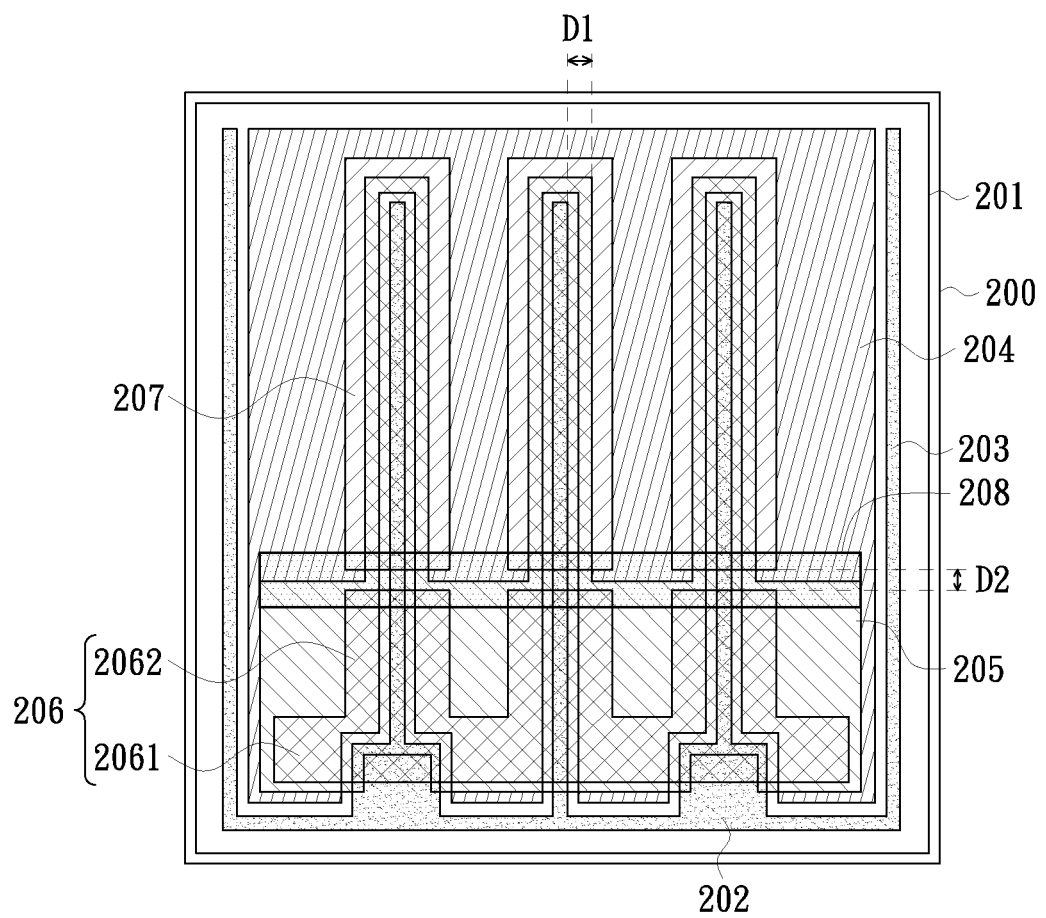
Figure 3C:
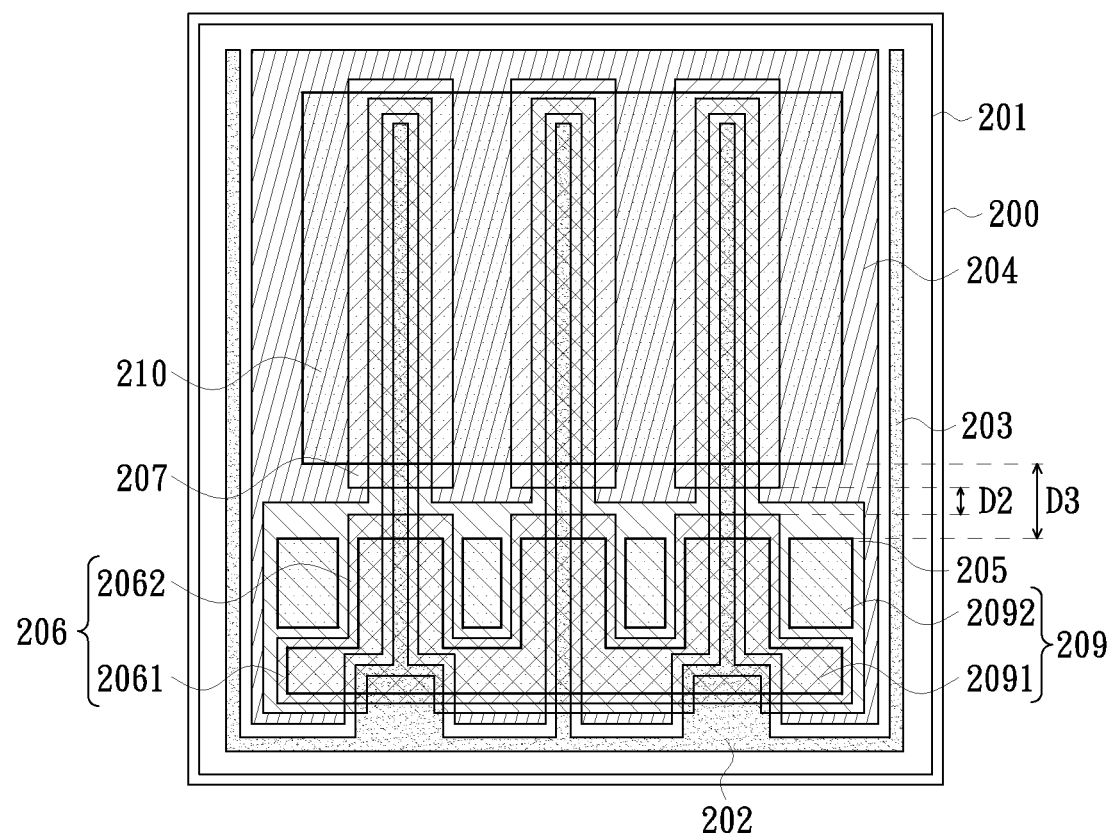
Figure 3D:
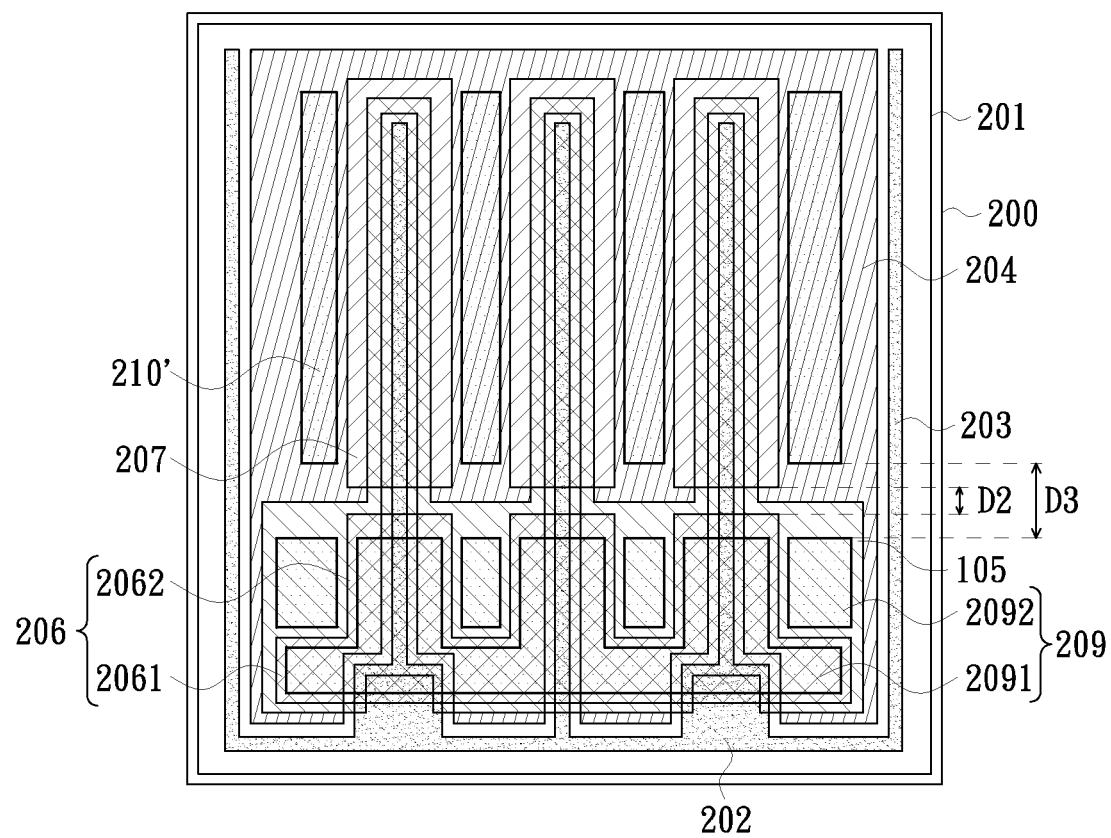

FIGS. 3A to 3C show the top view of the optoelectronic device disclosed in the second embodiment. As FIG. 3A shows, the optoelectronic device comprises a substrate 200, a first semiconductor layer 201, a first electrode 202 and a first extension electrode 203 extended from the first electrode 202. Then, an active layer (not shown) and a second semiconductor layer (not shown) are formed on the first semiconductor layer 201, and a second electrode 204 is formed on the second semiconductor layer (not shown), and the smallest distance D1 between the first extension electrode 203 and the second electrode 204 is defined. The smallest distance D1 between the first extension electrode 203 and the second electrode 204 can be in a range of 10~50 μm, 10~40 μm, 10~30 μm, 10~20 μm or 10~15 μm.

Besides, the second electrode 204 comprises a second extension electrode (not shown) extended from the second electrode 204. In one embodiment, the second extension electrode (not shown) can be formed between the two first extension electrodes 203. In one embodiment, a reflective layer (not shown) can also be selectively formed on the area of the second semiconductor layer (not shown), where is not covered by the second electrode 204 and the second extension electrode (not shown), to improve the reflectivity. The first extension electrode 203 and the second extension electrode (not shown) can be arc-shaped or curved based on different layouts.

Then, a first insulation layer 205 is formed to cover a portion of the second electrode 204 and a portion of the first extension electrode 203 to reveal the first electrode 202, a portion of the first extension electrode 203 and a portion of the second electrode 204.

Finally, a third electrode 206 can be formed on the first electrode 202, the first extension electrode 203 and the first insulation layer 205, and electrically connects to the first electrode 202 and the first extension electrode 203. A fourth electrode 207 can be formed on the second electrode 204 and a portion of the first insulation layer 205, and electrically connects to the second electrode 204.

The third electrode 206 can be arranged in a comb shape. The third electrode 206 comprises a first planar region 2061 and a first protrusion 2062. The first planar region 2061 can be an approximately rectangular structure, and the first protrusion 2062 can be extended from the first planar region 2061 and cover the first extension electrode 203 which is not covered by the first planar region 2061. In this embodiment, the side of the first protrusion 2062 which is parallel to the long side of the first extension electrode 203 is longer than the side of the first protrusion 2062 which is perpendicular to the long side of the first extension electrode 203.

The fourth electrode 207 can be an approximately rectangular structure and covers the first extension electrode 203 which is covered by the first insulation layer 205, wherein the smallest distance D2 between the first protrusion 2062 and the fourth electrode 207 can be defined. The smallest distance D2 between the first protrusion 2062 and the fourth electrode 207 can be in a range of 1~10 μm, 2~10 μm, 4~10 μm, 6~10 μm, or 8~10 μm.

In this embodiment, with the comb shape of the third electrode 206 and the precise alignment of the third electrode 206 with the first electrode 202 and the first extension electrode 203, the third electrode 206 and the fourth electrode 207 can be minimized and the cost of materials can be reduced.

In this embodiment, the first protrusion 2062 and the fourth electrode 207 can be as close as possible to increase the covered area of the first extension electrode 203 and decrease the uncovered area of the first insulation layer 205 so the contacting area of the third electrode 206 and the first extension electrode 203 is increased to enhance the electrical reliability, and the revealed area of the insulation layer 205 is decreased to increase the reflective area for reflecting light and increasing light extraction.

In one embodiment, in order to obtain the above mentioned function, the smallest distance D2 between the first protrusion 2062 and the fourth electrode 207 should be as small as possible, and can be smaller than the smallest distance D1 between the first extension electrode 203 and the second electrode 204.

In one embodiment, the area of the first extension electrode 203 not covered by the third electrode 206 and the fourth electrode 207 is smaller than 2%, 1.8%, 1.5%, 1.3%, 1%, or 0.8% of the total area of the first extension electrode 203.

As FIG. 3B shows, in one embodiment, a second insulation layer 208 is formed to cover the first protrusion 2062, the fourth electrode 207, a portion of the first extension electrode 203 and a portion of the first insulation layer 205 to prevent short-circuit risk due to the shrinkage of the smallest distance D2 between the first protrusion 2062 and the s fourth electrode 207.

As FIG. 3C shows, in one embodiment, a first bonding pad 209 and a second bonding pad 210 are formed on the third electrode 206 and the fourth electrode 207 respectively. The first bonding pad 209 includes at least a first region 2091, of which the shape is arranged in a comb, formed on the third electrode 206 and a second region 2092 formed between the two first extension electrodes 203 and on the first insulation layer 205. The second bonding pad 210 is approximately rectangular structure and defines the smallest distance D3 between the first bonding pad 209 and the second bonding pad 210. In one embodiment, the smallest distance D2 between the first protrusion 2062 and the fourth electrode 207 can be smaller than the smallest distance D3 between the first bonding pad 209 and the second bonding pad 210. The smallest distance D3 between the first bonding pad 209 and the second bonding pad 210 can be in a range of 40~600 µm, 60~600 µm, 80~600 µm, 100~600 µm, 150~600 µm, 200~600 µm, 250~600 µm, 300~600 µm, 350~600 µm, 400~600 µm, 450~600 µm, 500~600 µm, or 550~600 µm.

In this embodiment, the second region 2092 of the first pad 209 dose not electrically contact with the first electrode 202, the first extension electrode 203, the second electrode 204, the third electrode 206, the fourth electrode 207, the second bonding pad 210 and the first region 2091 of the first pad 209. The second region 2092 is made of the material of which the thermal conductivity is greater than 50 W/ml and the reflectivity greater than 50% such as Cu, Al, Sn, Au, Pt and Ag. When the optoelectronic device bears the push force during the flip chip process, the first extension electrode 203 and the third electrode 206 are not pulled directly by the push force. The design mentioned above can increase the strength of the optoelectronic device and reduce the risk of failure. The characteristics of high thermal conductivity and the high reflectivity make the second region 2092 to be the thermal dissipation path of the optoelectronic device and increase the reflective region for reflecting light and increasing light extraction.

In one embodiment, a plurality of second bonding pads 210' can be formed on the fourth electrode 207 and does not cover the first extension electrode 203.

The first electrode 202, the first extension electrode 203, the second electrode 204, the third electrode 206, the fourth electrode 207, the first bonding pad 209 and the second bonding pad 210, 210' can be made of metal material such as Cr, Ti, Ni, Pt, Cu, Au, Al, W, Sn, Ag, or the combination thereof.

Specifically, the optoelectronic device comprises light-emitting diode (LED), photodiode, photo resister, laser diode, infrared emitter, organic light-emitting diode and solar cell. The substrate 100, 200 can be a growing or carrying base. The material of the substrate 100, 200 comprises an electrically conductive substrate, electrically insulating substrate, transparent substrate, or opaque substrate. The material of the electrically conductive substrate can be metal such as Ge and GaAs, oxide such as $LiAlO_2$ and ZnO, nitrogen compound such as GaN and AlN, phosphide such as InP, silicon compound such as SiC, or Si, The material of the transparent substrate can be chosen from sapphire ($Al_2O_3$), $LiAlO_2$, ZnO, GaN, MN, glass, diamond, CVD diamond, diamond-like carbon (DLC), spinel ($MgAl_2O_3$), $SiO_x$, or $LiGaO_2$.

The first semiconductor layer 101, 201 and the second semiconductor layer (not shown) are different in electricity, polarity or dopant, or are the different semiconductor materials used for providing electrons and holes, wherein the semiconductor material can be single semiconductor material layer or multiple semiconductor material layers. The polarity can be chosen from any two of p-type, n-type and i-type. The active layer (not shown) is disposed between the first semiconductor layer 101, 201 and the second semiconductor layer (not shown) where the electrical energy and the light energy can be converted or stimulated converted. The devices which can convert or stimulated convert the electrical energy into the light energy are like light-emitting diode, liquid crystal display, and organic light-emitting diode. The devices which can convert or stimulated convert the light energy into the electrical energy are like solar cell and optoelectronic diode. The material of the first semiconductor layer 101, 201, the active layer (not shown) and the second semiconductor layer (not shown) comprises Ga, Al, In, As, P, N, Si, and the combination thereof.

The optoelectronic device of another embodiment in the application is a light-emitting diode, of which the light spectrum can be adjusted by changing the essentially physical or chemical factor of the single semiconductor material layer or the multiple semiconductor material layers. The material of the single semiconductor material layer or the multiple semiconductor material layers can contain elements selected from Al, Ga, In, P, N, Zn, O, or the combination thereof. The structure of the active layer (not shown) can be single heterostructure (SH), double heterostructure (DH), double-side double heterostructure (DDH) or multi-quantum well (MQW), wherein the wavelength of the light emitted from the active layer (not shown) can be changed by adjusting the number of the pairs of MQW.

In one embodiment of the application, a buffer layer (not shown) can be selectively disposed between the first semiconductor layer 101, 201 and the substrate 100, 200. The buffer layer is between the two material systems to transit the material system of the substrate 100, 200 to the material system of the first semiconductor layer 101, 201. For the structure of the light-emitting diode, the buffer layer is used to reduce the crystal mismatch between two materials. On the other hand, the buffer layer comprises a single layer, multiple layers or a structure which comprises two materials or two separated structures. The material of the buffer layer can be selected from organic material, inorganic material, metal or semiconductor material. The structure of the buffer layer can be a reflector layer, a thermally conductive layer, an electrically conductive layer, an ohmic contact layer, an anti-deformation layer, a stress release layer, a bonding layer, a wavelength conversion layer or a mechanically fixing structure. In one embodiment, the material of the buffer layer can be MN or GaN, and the buffer layer can be formed by sputtering or atomic layer deposition (ALD).

A contacting layer (not shown) can be selectively formed on the second semiconductor layer (not shown). The contacting layer is disposed on the side of the second semiconductor layer (not shown) away from the active layer (not shown). Specifically, the contacting layer can be optical layer, electrical layer, or the combination thereof. The optical layer can change the radiation or the light from or entering the active layer (not shown), wherein the optical layer can change but not limited to the frequency, the wavelength, the intensity, the flux, the efficiency, the color temperature, rendering index, light field, angle of view. The electrical layer can change the value, density, distribution of voltage, resistor, current and capacitance of any two relative sides of the contacting layer. The material of the contacting layer comprises oxide such as conductive oxide, transparent oxide and the oxide with the transparency over 50%, metal such as transparent metal and the metal with transparency over 50%, organic material, inorganic material, fluoresce material, ceramic, semiconductor material and doping semiconductor material. In some applications, the material of the contacting layer can be selected from InTiO, CdSnO, SbSnO, InZnO, ZnAlO or ZnSnO. If the material of the contacting layer is transparent metal, the thickness of the contacting layer is in a range of 0.005 μm~0.6 μm.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. An optoelectronic device, comprising:
   a semiconductor stack comprising a first semiconductor layer, an active layer, and a second semiconductor layer;
   a first electrode formed over the first semiconductor layer;
   a second electrode formed over the second semiconductor layer;
   a third electrode formed over a portion of the first electrode and electrically connecting with the first electrode; and
   a fourth electrode formed over a portion of the first electrode and a portion of the second electrode, and electrically connecting with the second electrode, wherein (i) the third electrode is arranged in a comb shape, (ii) the third electrode comprises a first main region and multiple first protrusions, extended from the first main region, and (iii) the first protrusions covers the portion of the first electrode which is not covered by the first main region.

2. An optoelectronic device according to claim 1, further comprising a substrate formed on the semiconductor stack layer, wherein the substrate and the first electrode are formed on the opposite sides of the semiconductor stack layer.

3. An optoelectronic device according to claim 1, wherein the first electrode comprises multiple first extension electrodes and/or the second electrode comprises multiple second extension electrodes.

4. An optoelectronic device according to claim 1, wherein the first semiconductor layer, the active layer and the second semiconductor layer comprise one element selected from Ga, Al, As, P, N, Si or the combination thereof.

5. An optoelectronic device according to claim 1, wherein the material of the first electrode, the second electrode, the third electrode and the fourth electrode is selected from Cr, Ti, Ni, Pt, Cu, Au, Al, W, Sn, Ag, or the combination thereof.

6. An optoelectronic device according to claim 1, wherein the fourth electrode comprises a second main region and multiple second protrusions, wherein the second main region is an approximately rectangular structure, and the multiple second protrusions are extended from the second main region and cover the portion of the first electrode which is not covered by the second main region.

7. An optoelectronic device according to claim 1, wherein the percentage of the area of the first electrode which is not covered by the third electrode and the fourth electrode is smaller than 2%.

8. An optoelectronic device according to claim 1, wherein the first main region is approximately rectangular, and the fourth electrode is an approximately rectangular structure and covers the portion of the first electrode.

9. An optoelectronic device according to claim 3, wherein a first length of one first protrusion parallel to the long side of the first electrode is greater than a second length of the one first protrusion perpendicular to the long side of the first extension electrode.

10. An optoelectronic device according to claim 3, further comprising a first pad formed on the third electrode and a second pad formed on the fourth electrode.

11. An optoelectronic device according to claim 10, wherein a smallest distance D2 between the third electrode and the fourth electrode is smaller than a smallest distance D3 between the first pad and the second pad.

12. An optoelectronic device according to claim 10, wherein the first pad comprises a first region arranged in a comb shape and a second region which is approximately rectangular, wherein the first region covers the third electrode and the second region is formed between two of the multiple first extension electrodes.

13. An optoelectronic device according to claim 12, further comprising an insulation layer formed on the first electrode and the second electrode, and the second region is on the insulation layer.

14. An optoelectronic device according to claim 12, wherein the material of the second region has a thermal conductivity greater than 50 W/ml and a reflectivity greater than 50%.

15. An optoelectronic device according to claim 14, wherein the material of the second region comprises Cu, Al, Sn, Au, Pt, Ag or the combination thereof.

16. An optoelectronic device according to claim 1, wherein a smallest distance D2 between the third electrode and the fourth electrode, is smaller than the smallest distance D1 between the first electrode and the second electrode.

17. An optoelectronic device according to claim 11, wherein the smallest distance D3 between the first pad and the second pad is in a range of 40~600 μm.

18. An optoelectronic device according to claim 3, wherein the first electrode and the second extension electrode are arc-shaped or curved.

19. An optoelectronic device according to claim 1, wherein the third electrode is formed over a portion of the first electrode and over a portion of the second electrode.

20. An optoelectronic device according to claim 16, wherein the smallest distance D1 between the first electrode and the second electrode is in a range of 10~50 μm, and/or the smallest distance D2 between the third electrode and the fourth electrode is in a range of 1~10 μm.

* * * * *